US011916052B2

(12) United States Patent
Hu et al.

(10) Patent No.: US 11,916,052 B2
(45) Date of Patent: Feb. 27, 2024

(54) STRETCHABLE DISPLAY MODULE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Li Hu, Wuhan (CN); Bingkun Yin, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 337 days.

(21) Appl. No.: 17/280,868

(22) PCT Filed: Nov. 20, 2020

(86) PCT No.: PCT/CN2020/130510
§ 371 (c)(1),
(2) Date: Mar. 26, 2021

(87) PCT Pub. No.: WO2022/095140
PCT Pub. Date: May 12, 2022

(65) Prior Publication Data
US 2022/0359477 A1 Nov. 10, 2022

(30) Foreign Application Priority Data

Nov. 9, 2020 (CN) .......................... 202011237892.9

(51) Int. Cl.
*H01L 25/16* (2023.01)
*H01L 23/538* (2006.01)
(Continued)

(52) U.S. Cl.
CPC ........ *H01L 25/167* (2013.01); *H01L 23/5386* (2013.01); *H01L 24/32* (2013.01);
(Continued)

(58) Field of Classification Search
CPC ...... H10K 59/18; H10K 50/841; H10K 71/00; H10K 59/131; H10K 50/844; H10K 50/81;
(Continued)

(56) References Cited

U.S. PATENT DOCUMENTS 10,651,265 B2 * 5/2020 Park ........................ H10K 59/18
11,011,599 B2 * 5/2021 Kim .................... H01L 25/0655
(Continued)

FOREIGN PATENT DOCUMENTS

CN  206249816 U  6/2017
CN  209133509 U  7/2019
(Continued)

OTHER PUBLICATIONS

Chinese Office Action in corresponding Chinese Patent Application No. 202011237892.9 dated May 31, 2022, pp. 1-11.
(Continued)

*Primary Examiner* — Mouloucoulaye Inoussa
(74) *Attorney, Agent, or Firm* — PV IP PC; Wei Te Chung; Zhigang Ma

(57) ABSTRACT

A stretchable display module and a manufacturing method thereof are provided. The stretchable display module includes a display layer including a plurality of display islands arranged and spaced apart from each other, wherein two of the adjacent display islands are electrically connected by a connecting wire; a transparent adhesive layer including a filling adhesive layer filled in a spacing region between the display islands, a first adhesive layer disposed on a surface of the display layer opposite an emitting direction of the
(Continued)

display layer, and a second adhesive layer disposed on a surface of the display layer in the emitting direction.

17 Claims, 9 Drawing Sheets

(51) Int. Cl.
*H01L 23/00* (2006.01)
*H01L 25/065* (2023.01)
*H01L 25/00* (2006.01)
*H01L 33/56* (2010.01)
*H10K 50/84* (2023.01)
*H10K 102/00* (2023.01)

(52) U.S. Cl.
CPC ............. *H01L 24/33* (2013.01); *H01L 24/83* (2013.01); *H01L 24/95* (2013.01); *H01L 25/0655* (2013.01); *H01L 25/50* (2013.01); *H01L 33/56* (2013.01); *H10K 50/841* (2023.02); *H01L 24/29* (2013.01); *H01L 2224/2929* (2013.01); *H01L 2224/32137* (2013.01); *H01L 2224/32225* (2013.01); *H01L 2224/33181* (2013.01); *H01L 2224/831* (2013.01); *H01L 2224/83005* (2013.01); *H01L 2224/83951* (2013.01); *H01L 2224/95001* (2013.01); *H01L 2924/0715* (2013.01); *H10K 2102/311* (2023.02)

(58) Field of Classification Search
CPC .... H10K 50/84; H10K 50/856; H10K 59/122; H10K 50/82; H10K 2102/311; H10K 59/1275; H10K 77/111; H10K 50/86; H10K 59/1213; H10K 59/124; H10K 50/8426; H10K 59/38; H10K 50/16; H10K 50/15; H10K 59/35; H10K 50/171; H10K 59/1216; H10K 59/1201; H10K 2102/351; H01L 25/50; H01L 24/95; H01L 25/167; H01L 23/5386; H01L 24/32; H01L 24/33; H01L 33/52; H01L 24/83; H01L 33/56; H01L 25/0655; H01L 25/0753; H01L 24/29; H01L 27/156; H01L 27/124; H01L 27/1225; H01L 27/1259; H01L 29/66757; H01L 29/7869; H01L 29/78675; H01L 27/1255; H01L 27/1251; H01L 29/66969; H01L 2224/2929; H01L 2224/831; H01L 2933/005; H01L 2224/32225; H01L 2224/32137; H01L 2224/83005; H01L 2224/95001; H01L 2924/0715; H01L 2224/33181; H01L 2224/83951; Y02E 10/549; G06F 3/041; G06F 1/1652; G06F 1/1637; H05B 33/22; H05B 33/14; G02B 26/0825; G09G 3/3225; G09G 3/20; G09G 3/3233; G09G 2310/0264; G09G 2300/0426; G09G 2310/0262; G09G 2330/12; G09G 2310/0251; G09G 2300/0861; G02F 1/133305; G02F 1/133308; G02F 1/13458; Y02P 70/50; H04N 17/004

See application file for complete search history.

(56) References Cited

U.S. PATENT DOCUMENTS

| 11,605,803 | B2* | 3/2023 | Kim | ............... H10K 59/131 |
| 2013/0005059 | A1* | 1/2013 | Song | ............... H01L 29/78603 |
| | | | | 438/28 |
| 2016/0323994 | A1* | 11/2016 | Kwon | ............... G02F 1/133305 |
| 2018/0046221 | A1* | 2/2018 | Choi | ............... H10K 77/111 |
| 2019/0041915 | A1* | 2/2019 | Park | ............... H10K 59/131 |
| 2019/0165312 | A1* | 5/2019 | Bae | ............... G09G 3/3225 |
| 2019/0181205 | A1* | 6/2019 | Kim | ............... H10K 71/00 |
| 2019/0205603 | A1* | 7/2019 | Lee | ............... G06V 40/1306 |
| 2019/0355799 | A1* | 11/2019 | Jeong | ............... H10K 59/1213 |
| 2019/0366496 | A1* | 12/2019 | Cano Coscia | ............... B23Q 1/26 |
| 2020/0027945 | A1* | 1/2020 | Kim | ............... H10K 50/81 |
| 2020/0144522 | A1* | 5/2020 | Jung | ............... H10K 59/122 |
| 2021/0082996 | A1* | 3/2021 | Ikeda | ............... H01L 33/62 |
| 2021/0098558 | A1* | 4/2021 | Chen | ............... H10K 59/131 |
| 2021/0143364 | A1* | 5/2021 | Jin | ............... H10K 59/124 |

FOREIGN PATENT DOCUMENTS

| CN | 110189637 A | 8/2019 |
| CN | 110459571 A | 11/2019 |
| CN | 110473475 A | 11/2019 |
| CN | 110603644 A | 12/2019 |
| CN | 111146245 A | 5/2020 |
| CN | 111402734 A | 7/2020 |
| JP | 2020148925 A | 9/2020 |
| KR | 20190005795 A | 1/2019 |

OTHER PUBLICATIONS

International Search Report in International application No. PCT/CN2020/130510, dated Jul. 26, 2021.
Written Opinion of the International Searching Authority in International application No. PCT/CN2020/130510, dated Jul. 26, 2021.

* cited by examiner

STRETCHABLE DISPLAY MODULE AND MANUFACTURING METHOD THEREOF

RELATED APPLICATIONS

This application is a Notional Phase of PCT Patent Application No. PCT/CN2020/130510 having international filed date of Nov. 20, 2020, which claims the benefit of priority of Chinese Patent Application Nos. 202011237892.9 filed on Nov. 9, 2020. The contents of the above applications are all incorporated by reference as if fully set forth herein in their entirety.

FIELD DISCLOSURE

The present disclosure relates to the technical field of displays, and in particular to a stretchable display module and a manufacturing method thereof.

BACKGROUND OF DISCLOSURE

In recent years, flexible display techniques have become one of research hotspots of the display field. In particular, an organic light-emitting diode (OLED) having a high degree of freedom of a physical deformation has created new possibilities of display form. Mechanical deformable display devices not only have a desirable aesthetic effect but also can bring great improvement to an original form of information display. For example, the display devices in mass production have completely changed the concept of mobile display devices with limited screen sizes, and do not limit the screen sizes anymore. Similarly, stretchable display devices further break the concept of the screen size limitation. Theoretically, complicated curvature deformation of the flexible display devices may be realized by the stretchable display devices, and thus the flexible display device may attach to any type of surface. These characteristics are necessary for the development of new electronic apparatuses (such as wearable apparatuses and vehicle-display apparatuses) and recently attract huge attention.

It is still one of the difficulties in current research and development to realize a high stretching rate of the stretchable display devices and maintain high strength to prevent from breaking and inhibit distortion of panels upon stretching.

SUMMARY OF INVENTION

Technical Problems

A stretchable display module and a manufacturing method thereof are provided in the present disclosure. The stretchable display module has a high stretching rate and strength.

Technical Solutions

In order to solve the technical problems above, in a first aspect, a stretchable display module is provided in the present disclosure. The stretchable display module includes:
  a display layer including a plurality of display islands arranged in an array and spaced apart from each other, wherein adjacent two of the display islands are electrically connected by a connecting wire;
  a transparent adhesive layer including a filling adhesive layer filled in a spacing region between the display islands, a first adhesive layer disposed on a surface of the display layer opposite an emitting direction of the display layer, and a second adhesive layer disposed on a surface of the display layer in the emitting direction, wherein the display islands are bonded as a whole by the transparent adhesive layer.

In a stretchable display module provided by an embodiment of the present disclosure, the stretchable display module also includes: a first stretchable layer attached on the first adhesive layer; and a second stretchable layer attached on the second adhesive layer.

In a stretchable display module provided by an embodiment of the present disclosure, each of the display islands individually and independently includes a flexible substrate island, an array driving island disposed on the flexible substrate island, a display device island disposed on the array driving island, and an encapsulation island disposed on the display device island.

In a stretchable display module provided by an embodiment of the present disclosure, the connecting wire is a curve wire.

In a stretchable display module provided by an embodiment of the present disclosure, the stretchable display module is partitioned into:
  a stretchable region including a display region and a gate driving circuit region disposed outside the display region, wherein the display islands are disposed in the display region, the gate driving circuit region includes a plurality of gate driving circuit islands spaced apart from each other, and adjacent two of the gate driving circuit islands are electrically connected by the connecting wire, and the adjacent gate driving circuit islands are electrically connected to the display islands by the connecting wire; and
  a non-stretchable region connected to a side of the stretchable region, wherein the non-stretchable region includes a bezel wire and a binding region.

In a stretchable display module provided by an embodiment of the present disclosure, a material of the first stretchable layer and the second stretchable layer includes polydimethylsiloxane.

In a stretchable display module provided by an embodiment of the present disclosure, a material of the transparent adhesive layer is an adhesive material including polydimethylsiloxane.

In a stretchable display module provided by an embodiment of the present disclosure, each of the display islands includes a plurality of sub-pixels arranged in an array.

In a stretchable display module provided by an embodiment of the present disclosure, a Young's modulus of the first stretchable layer is greater than a Young's modulus of 80% of the transparent adhesive layer and less than or equal to a Young's modulus of 120% of the transparent adhesive layer, and a Young's modulus of the second stretchable layer is greater than the Young's modulus of 80% of the transparent adhesive layer and less than or equal to the Young's modulus of 120% of the transparent adhesive layer.

In a stretchable display module provided by an embodiment of the present disclosure, the connecting wire is disposed in the same layer as the array driving island.

In a stretchable display module provided by an embodiment of the present disclosure, the display device island includes an organic light-emitting diode (OLED) display device or a micro light-emitting diode (Micro LED) display device.

In a stretchable display module provided by an embodiment of the present disclosure, the curve wire is formed by a wire portion bending and extending along at least two different directions.

In a stretchable display module provided by an embodiment of the present disclosure, each of the gate driving circuit islands includes a second flexible substrate island and a gate driving circuit disposed on the second flexible substrate island. The bezel wire is electrically connected to the adjacent display islands and the adjacent gate driving circuit islands by the connecting wire. In another aspect, a manufacturing method for a stretchable display module is also provided by the present disclosure. The manufacturing method includes steps of:

S101, providing a rigid base and forming a flexible substrate on the rigid base;

S102, forming a plurality of array driving islands on the flexible substrate, and forming a connecting wire electrically connected between adjacent ones of the array driving islands, wherein the array driving islands are arranged in an array and spaced apart from each other;

S103, correspondingly forming a plurality of display device islands on the array driving islands;

S104, correspondingly forming a plurality of encapsulation islands on the display device islands;

S105, forming a protective layer on the encapsulation islands;

S106, stripping the rigid base;

S107, patterning the flexible substrate, removing the flexible substrate corresponding to a spacing region of the array driving islands, and forming a plurality of flexible substrate islands corresponding to the array driving islands, thereby forming a plurality of display islands arranged in an array and spaced apart from each other, wherein each of the display islands includes the flexible substrate islands, the array driving islands, the display device islands, and the encapsulation islands stacked in sequence;

S108, providing a first stretchable layer, forming a first adhesive layer on the first stretchable layer, and attaching the first adhesive layer onto a surface of the flexible substrate islands away from the array driving islands;

S109, stripping the protective layer;

S110, forming a filling adhesive layer in a spacing region of the display islands, and forming a second adhesive layer on a surface of the encapsulation islands away from the display device islands; and S111, providing a second stretchable layer and attaching the second stretchable layer onto the second adhesive layer.

In a manufacturing method for a stretchable display module provided by the present disclosure, in the step of S107, a patterning process is completed by an exposure and etching process or a laser cutting process.

In a manufacturing method for a stretchable display module provided by the present disclosure, in the step of S110, the filling adhesive layer and the second adhesive layer are simultaneously formed by one process.

In another aspect, a manufacturing method for a stretchable display module is also provided by the present disclosure. The manufacturing method includes steps of:

S201, providing a rigid base, and forming a flexible substrate on the rigid base;

S202, forming a plurality of array driving islands on the flexible substrate, and forming a connecting wire electrically connected between adjacent two of the array driving islands, wherein the array driving islands are arranged in an array and spaced apart from each other;

S203, correspondingly forming a plurality display device islands on the array driving islands;

S204, correspondingly forming a plurality of encapsulation islands on the display device islands;

S205, forming a first filling adhesive layer in a spacing region formed and stacked by the array driving islands, the display device islands, and the encapsulation islands, forming a second adhesive layer on a surface of the encapsulation islands away from the display device islands, providing a first stretchable layer, and attaching the first stretchable layer onto the second adhesive layer;

S206, forming a protective layer on the first stretchable layer;

S207, stripping the rigid base;

S208, patterning the flexible substrate, removing the flexible substrate corresponding to a spacing region of the array driving islands, and forming a plurality of flexible substrate islands corresponding to the array driving islands, thereby forming a plurality of display islands arranged in an array and spaced apart from each other, wherein each of the display islands includes the flexible substrate islands, the array driving islands, the display device islands, and the encapsulation islands stacked in sequence;

S209, forming a second filling adhesive layer in a spacing region of the flexible substrate islands, and forming a first adhesive layer on a surface of the flexible substrate islands away from the array driving islands;

S210, providing a second stretchable layer and attaching the second stretchable layer onto the first adhesive layer; and S211, stripping the protective layer.

Beneficial Effects

Compared with the existing techniques, a stretchable display module and a manufacturing method thereof are provided in the present disclosure. The stretchable display module includes a display layer, and the display layer is formed by a plurality of display islands and a connecting wire connected between the adjacent display islands. Thus, the display layer is partitioned into independent island shapes, so as to reduce Young's modulus of the whole display layer and obtain a high stretching rate. Moreover, the separated display islands are bonded to form into a whole by a transparent adhesive layer, so as to enhance the strength of the display layer composed of independent display islands and achieve an effect of inhibiting distortion of a panel upon stretching.

BRIEF DESCRIPTION OF DRAWINGS

In order to clearly illustrate the technical solutions in the embodiments of the present disclosure, the drawings used in the description of the embodiments will be briefly introduced below. Obviously, the drawings in the following description are only some embodiments of the disclosure. Other drawings can also be obtained from those skilled in the art based on these drawings without paying any inventive effort.

DETAILED DESCRIPTION OF EMBODIMENTS

The technical solutions in the embodiments of the present disclosure are clearly and completely described in the following description, which is combined with the drawings in the embodiments of the present disclosure. Obviously, the embodiments described in the following description are only a part of the embodiments of the disclosure, not all the embodiments. Other embodiments obtained from those skilled in the art based on the embodiments of the present disclosure without paying any inventive effort belong to a protected scope of the present disclosure.

In the description of the present disclosure, it is realized that the direction and position relationship indicated by the terms, such as "central", "longitudinal", "transversal", "lengths", "width", "thickness", "upper", "lower", "front", "post", "left", "right", "vertical", "horizontal", "top", "down", "inside", and "outside", are direction and position relationship based on the drawings of this disclosure. The terms only facilitate describing the present disclosure and simplifying the description, not indicate or imply that the devices or elements must have a specific direction, be configured, and operated in a specific direction. Therefore, the terms should not be realized to limit the present invention. Moreover, the terms "first" and "second" are used for descriptive purposes only, and cannot be realized as indicating or implying relative importance or implying the number of indicated technical features. Thus, the technical features defined as "first" and "second" may explicitly or implicitly include one or more of the technical features. In the description of the present disclosure, a meaning of "a plurality of" is two or more, unless specifically defined.

In the present disclosure, the term "exemplary" is used as an example, an illustration, or an explanation. Any embodiment described as "exemplary" in the present disclosure is not certainly interpreted to be more preferred or advantageous than other embodiments. The description is given below, so that those skilled in the art may realize and use the present disclosure. In the description below, details are stated for the purpose of explanation. It is understood that those skilled in the art may recognize that the present disclosure may be realized in the case of without using these specific details. In other examples, the commonly known structures and the processes are not described in detail, so as to prevent the description of the present disclosure from being obscure by the unnecessary details. Therefore, the present disclosure is not intended to be limited in the embodiments shown in the specification but is consistent with the broadest scope corresponding to the disclosed principles and the characteristics of the present disclosure.

Figure 1:
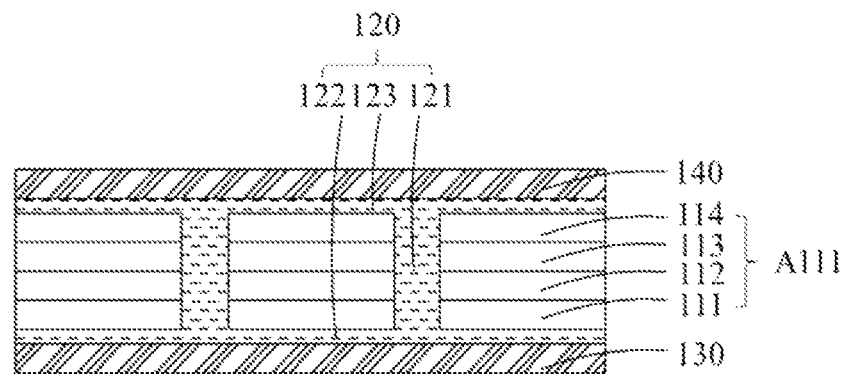
FIG. 1 is a schematic view of a sectional structure of a stretchable display module provided by an embodiment of the present disclosure.

A stretchable display module is provided by an embodiment of the present disclosure. The stretchable display module is illustrated in detail below in combination with a schematic view of a sectional structure provided by FIG. 1 and a schematic view of a planar structure provided by FIG. 2.

Figure 2:
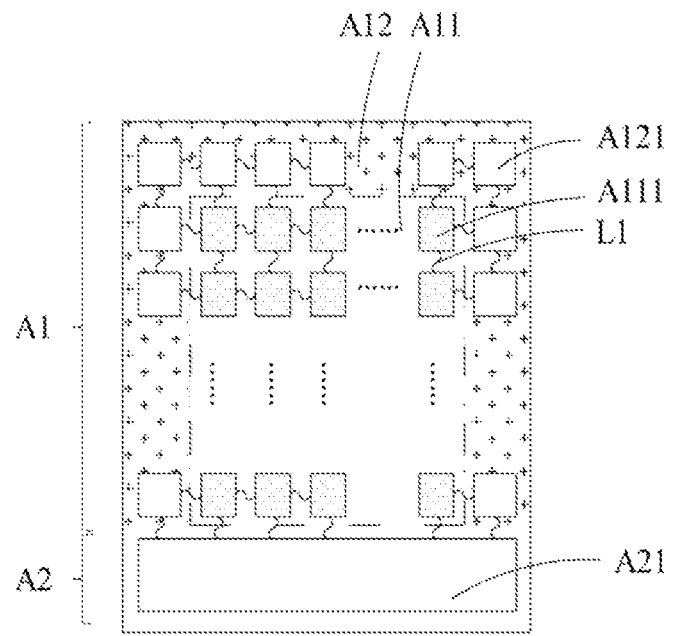
FIG. 2 is a schematic view of a planar structure of a stretchable display module provided by an embodiment of the present disclosure.

The stretchable display module includes:

a display layer including a plurality of display islands A111 (only three display islands are exemplarily shown in the figures) arranged in an array and spaced apart from each other, wherein adjacent two of the display islands A111 are electrically connected by a connecting wire L1, and the connecting wire L1 usually includes a data line and a signal line, which served as a signal transmission path between the display islands A111 arranged at intervals;

a transparent adhesive layer 120 including a filing adhesive layer 121 filled in a spacing region between the display islands A111, a first adhesive layer 122 disposed on a surface of the display layer opposite an emitting direction of the display layer (the emitting direction of the display layer is defined as an upward direction in FIG. 2), and a second adhesive layer 123 disposed on a surface of the display layer in the emitting direction, wherein the filling adhesive layer 121, the first adhesive layer 122, and the second adhesive layer 123 are bonded to form an integral transparent adhesive layer, and thus the display islands are bonded as a whole by the transparent adhesive layer.

By a design above, the display layer is arranged into the display islands at intervals, and the adjacent display islands are electrically connected by the connecting wire. Thus, the display layer is partitioned into independent island shapes, so as to reduce Young's modulus of the whole display layer and obtain a high stretching rate. Moreover, the separated display islands are bonded to form into a whole by a transparent adhesive layer, so as to enhance the strength of the display layer composed of independent display islands and achieve an effect of inhibiting distortion of a panel upon stretching.

In some embodiments, the stretchable display module also includes a first stretchable layer 130 attached on the first adhesive layer 122; and a second stretchable layer 140 attached on the second adhesive layer 123. By arranging an upper stretchable layer and a lower stretchable layer into supportive layers, the strength of the display layer may be further enhanced and thus achieve the effect of inhibiting distortion of a panel upon stretching.

In some embodiments, each of the display islands A111 individually and independently includes a flexible substrate island 111, an array driving island 112 disposed on the flexible substrate island 111 (it is supplemented that the connecting wire and the array driving island 112 are disposed in the same layer), a display device island 113 disposed on the array driving island 112, and an encapsulation island 114 disposed on the display device island 113. That is, each structure layer in the display layer is partitioned into independent islands. In a first aspect, the conventional flexible substrate formed in an entire surface form is patterned into a plurality of independent and spaced flexible substrate islands 111, so as to avoid the problem of a low stretching rate caused by a high Young's modulus of the flexible substrate material. In another aspect, the conventional encapsulation substrate formed in the entire surface form is patterned into a plurality of independent and spaced encapsulation islands 114, and the display device island 113 of each of the display islands A111 is independently encapsulated by one of the encapsulation islands 114, so as to avoid the risk of encapsulation failure caused by cracking of the encapsulation layer upon stretching, and improve the reliability of the stretchable display module.

It is supplemented that in an embodiment provided by the present disclosure, the flexible substrate islands are flexible substrate commonly disposed in a flexible display panel, which may be a polyimide film or a double-layer polyimide film with a silicon nitride/silicon oxide film embedded in a middle layer. Based on the special structure design of the present disclosure, the flexible substrate in the display region is patterned into a plurality of island shapes spaced apart from each other, and thus it is defined as the flexible substrate islands.

The names of other structures are also defined for the same reason. Specifically, the array driving island includes a driving circuit for driving the display device island on the upper layer and specifically includes a plurality of thin-film transistors arranged in an array.

The display device island includes a plurality of display devices corresponding and electrically connected to the thin-film transistors of the array driving islands in one-to-one correspondence, wherein the thin-film transistors are arranged in an array. The display devices may be organic light-emitting diode (OLED) display devices, micro light-emitting diode (Micro LED) display devices, or other display devices that may be driven by the thin-film transistors.

The encapsulation islands are structural layers for encapsulating the display device islands, which serve as a barrier layer for inhibiting the water and gas in an external environment from entering and invading the display devices in the display device islands, so as to prevent the failure of the display devices. An encapsulating form of the encapsulation layer is usually a thin-film encapsulation including an inorganic film/organic film/inorganic film stacked in sequence.

The flexible substrate island, the array driving island, the display device island, and the encapsulation island are stacked in correspondence to form the display island.

In some embodiments, the connecting wire and the array driving islands are disposed in the same layer. That is, the connecting wire is electrically connected to adjacent ones of the array driving islands, so as to realize telecommunication between adjacent ones of the display islands and transmit electric signals.

In some embodiments, the connecting wire L1 is a curve wire. For example, the connecting wire L1 may be a wavy wire. Specifically, the connecting wire L1 may be formed by a wire portion bending and extending along at least two different directions, and, that is, an S-shaped wire as shown in FIG. 2 are formed, so as to reduce the risk of breaking of the connecting wire upon stretching. Certainly, the connecting wire L1 may be in other shapes as long as the fact that an actual length of the connecting wire L1 is greater than a spacing width between the adjacent display islands A111 connected by the connecting wire is ensure. The shapes are not limited in the present disclosure.

In some embodiments, the stretchable display module is partitioned into:
  a stretchable region A1 including a display region A11 and a gate driving circuit region A12 disposed outside the display region A11, wherein the display islands A111 are disposed in the display region A11, the gate driving circuit region A12 includes a plurality of gate driving circuit islands A121 spaced apart from each other, the gate driving circuit islands A121 usually include a second flexible substrate island (disposed in the same layer as the flexible substrate island of the display islands A111) and a gate driving circuit disposed on the second flexible substrate island, wherein adjacent two of the gate driving circuit islands A121 are electrically connected by the connecting wire L1, and the adjacent gate driving circuit islands A121 are electrically connected to the display islands A111 by the connecting wire; and
  a non-stretchable region A2 connected to a side of the stretchable region A1, wherein the non-stretchable region A2 includes a bezel wire and a binding region (which are not shown in the figures, and usually include a plurality of binding terminals bond to a chip on film (COF)/flexible printed circuit (FPC)). Similarly, the bezel wire and the adjacent display islands A111 and the gate driving circuit islands A121 are electrically connected by the connecting wire L1, wherein the non-stretchable region A2 includes a flexible substrate disposed in the same layer as the flexible substrate islands 111, but the flexible substrate of the non-stretchable region A2 is not patterned, is an intact layer, and thus inhibits the stretching of the non-stretchable region A2.

Additionally, it is easily understood that the filling adhesive layer 120 is also certainly filled in the spacing between adjacent two of the gate driving circuit islands A121, the spacing between the adjacent gate driving circuit islands A121 and the display islands A111, and the spacing between the non-stretchable region A2 and the gate driving circuit islands A121 and the display islands A111. That is, all the spacing between the first stretchable layer 130 and the second stretchable layer 140 is filled by the filling adhesive layer 120, so as to form a complete whole.

In some embodiments, a material of the first stretchable layer and the second stretchable layer may be a stretchable transparent material. For example, the material of the first stretchable layer and the second stretchable layer includes polydimethylsiloxane having a low Young's modulus.

In some embodiments, a material of the transparent material is selected from the stretchable transparent materials. For example, the material of the transparent materials is an adhesive material including polydimethylsiloxane. Certainly, an optical transparent adhesive or optical transparent resin commonly used for binding layer structures in the present technical field may also be used as the material of the transparent adhesive layer.

In some embodiments, Young's modulus of the first stretchable layer, Young's modulus of the second stretchable layer, and Young's modulus of the transparent adhesive layer need to be close, so as to prevent a poor stripping of the interface upon stretching caused by a large difference of the stretching rate between the first stretchable layer, the second stretchable layer, and the transparent adhesive layer. Specifically, Young's modulus of the first stretchable layer is greater than or equal to Young's modulus of 80% of the transparent adhesive layer and less than or equal to Young's modulus of 120% of the transparent adhesive layer, and Young's modulus of the second stretchable layer is greater than or equal to the Young's modulus of 80% of the transparent adhesive layer and less than or equal to the Young's modulus of 120% of the transparent adhesive layer. Further, Young's modulus of the first stretchable layer is greater than or equal to Young's modulus of 90% of the transparent adhesive layer and less than or equal to Young's modulus of 110% of the transparent adhesive layer, and Young's modulus of the second stretchable layer is greater than or equal to the Young's modulus of 90% of the transparent adhesive layer and less than or equal to the Young's modulus of 110% of the transparent adhesive layer.

It is supplemented that each of the display islands includes a plurality of sub-pixels arranged in an array, and the size of each of the display islands and spacing between the adjacent display islands are decided according to an actual technical process, which is not limited in the present disclosure.

In another aspect, a manufacturing method for the stretchable display module above is also provided in an embodiment of the present disclosure. The manufacturing steps are described below in combination with the structural flow schematic views of the manufacturing method provided by FIG. 3a-3h, and a schematic text flow chart of the manufacturing method provided by FIG. 4 (it is noted that in order to clearly illustrate the manufacturing steps, only a sectional structure of a display region is shown, which does not affect the understanding of the manufacturing method).

Figure 3A:
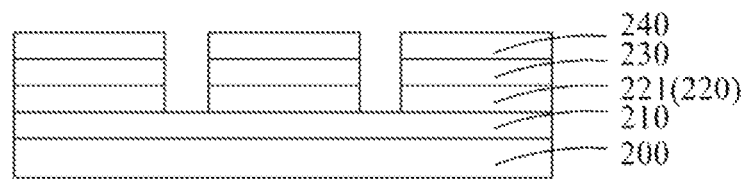
FIG. 3a-3h are structural flow schematic views of a manufacturing method of a stretchable display module provided by an embodiment of the present disclosure.
Figure 3B:
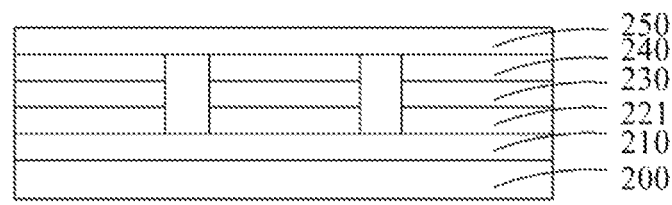
Figure 3C:
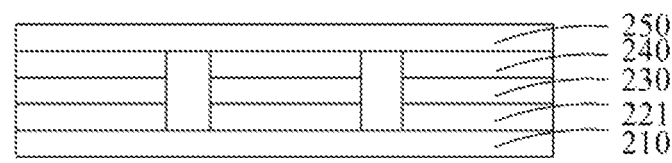
Figure 3D:
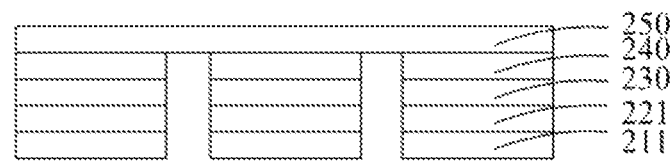
Figure 3E:
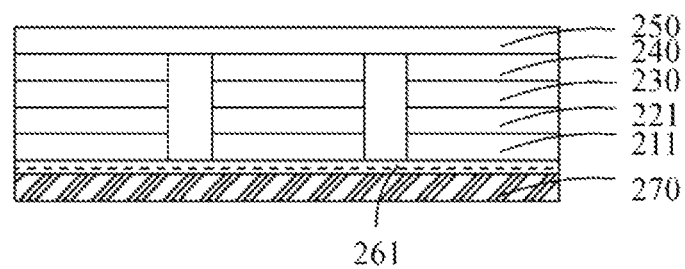
Figure 3F:
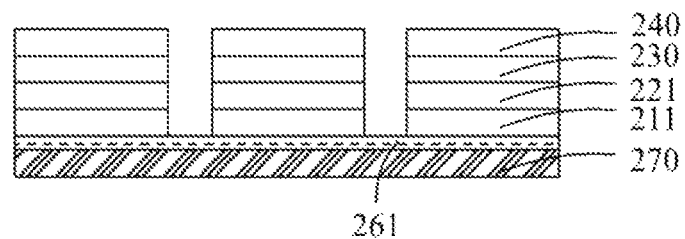
Figure 3G:
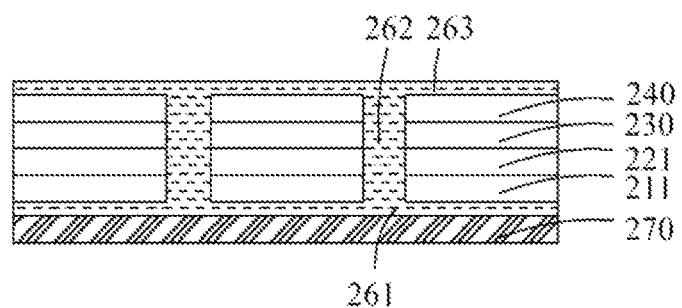
Figure 3H:
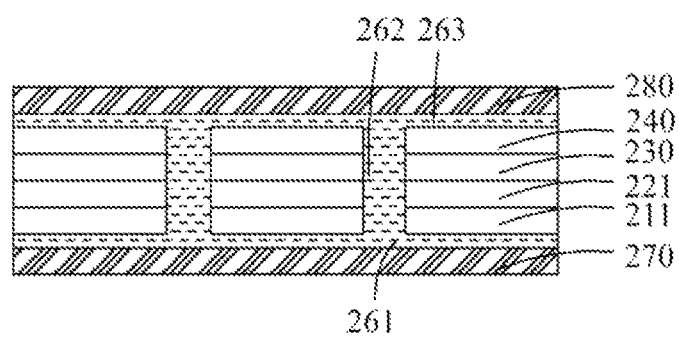
Figure 4:
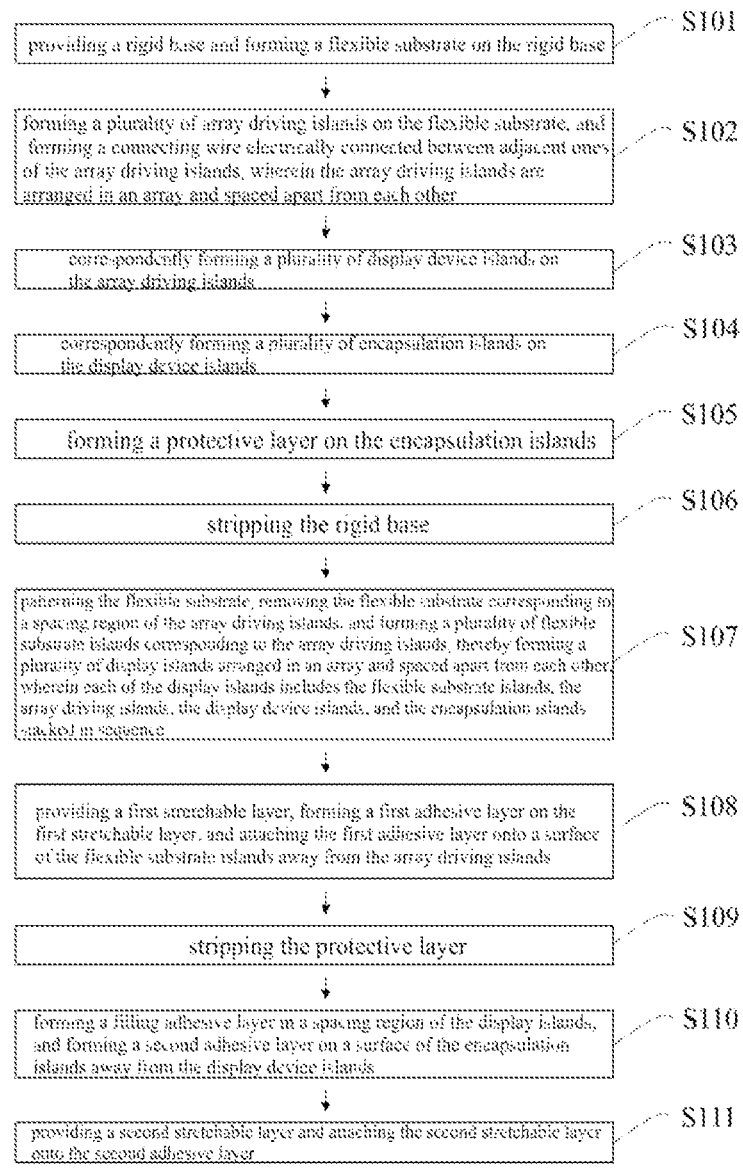
FIG. 4 is a schematic text flow chart of a manufacturing method of a stretchable display module provided by an embodiment of the present disclosure.

Specifically, the manufacturing method includes steps of:

S101, providing a rigid base 200 and forming a flexible substrate 210 on the rigid base 200, wherein the rigid base 200 is usually a glass base, and the flexible substrate 210 is usually a polyimide membrane;

S102, forming an array driving layer 220 on the flexible substrate 210, wherein the array driving layer 220 includes a plurality of array driving islands 221 and a connecting wire (not shown in the figures) electrically connected between adjacent ones of the array driving islands 221, the array driving islands 221 are arranged in an array and spaced apart from each other, and the array driving layer 220 certainly also includes a plurality of gate driving circuit islands, a bezel wire, a plurality of binding terminals, etc. in the regions excluding the display region, which may be seen in the above embodiments for details;

S103, correspondently forming a plurality of display device islands 230 on the array driving islands 221, wherein the display device islands 230 are OLED display device islands or Micro LED display device islands;

S104, correspondently forming a plurality of encapsulation islands 240 on the display device islands 230, which means that a structure shown in FIG. 3a is formed;

S105, forming a protective layer 250 on the encapsulation islands 240, which means that a structure shown in FIG. 3b is formed, wherein the protective layer 250 is configured to protect the encapsulation islands 240 on the lower layer from damage such as scratching in the subsequent processes, and the protective layer 250 does not damage the encapsulation islands 240 on the lower layer after stripping in the subsequent processes;

S106, stripping the rigid base 200, so as to expose the flexible substrate 210, which means that a structure shown in FIG. 3c is formed, wherein the stripping of the rigid base 200 is completed usually by a laser stripping process;

S107, patterning the flexible substrate 210, removing the flexible substrate corresponding to a spacing region of the array driving islands 221, and forming a plurality of flexible substrate islands 211 corresponding to the array driving islands 221, which means that a structure shown in FIG. 3d is formed, thereby forming a plurality of display islands formed by the flexible substrate islands 211, the array driving islands 221, the display device islands 230, and the encapsulation islands 240 stacked in sequence;

S108, providing a first stretchable layer 270, forming a first adhesive layer 261 on the first stretchable layer 270, and attaching the first adhesive layer 261 onto a surface of the flexible substrate islands 211 away from the array driving islands 221, which means that a structure shown in FIG. 3e is formed, wherein the first adhesive layer 261 is formed by coating and curing a prepolymerized colloid, and the first adhesive layer 261 may be also formed by laminating a solid adhesive layer in the corresponding size under a certain pressure after attaching;

S109, stripping the protective layer 250, which means that a structure shown in FIG. 3f is formed;

S110, forming a filling adhesive layer 262 in a spacing region of the display islands, and forming a second adhesive layer 263 on a surface of the encapsulation islands 240 away from the display device islands 230, which means that a structure shown in FIG. 3g is formed, wherein the filling adhesive layer 262 and the second adhesive layer 263 are simultaneously formed by one process, the formed filled adhesive layer 262, the second adhesive layer 263, and the first adhesive layer 261 are bonded to form an integral transparent adhesive layer, and thus the display islands are bonded as a whole by the transparent adhesive layer; and S111, providing a second stretchable layer 280 and attaching the second stretchable layer 280 onto the second adhesive layer 263, which means that a manufacturing process is completed, and a stretchable display module shown in FIG. 3h is formed.

In some embodiments, in the step of S107, the patterning process or other patterning techniques are completed by an exposure and etching process or a laser cutting process, which is not limited in the present disclosure.

In another aspect, a manufacturing method for the stretchable display module above is also provided by an embodiment of the present disclosure, which is basically the same as the manufacturing method provided by the embodiment above. The difference is only a part of the sequence of the steps are switched, which does not affect the final structure of the formed stretchable display module. The manufacturing steps are described below in combination with the structural flow schematic views of the manufacturing method provided by FIG. 5a-5h, and a schematic text flow chart of the manufacturing method provided by FIG. 6 (it is noted that in order to clearly illustrate the manufacturing steps, only a sectional structure of a display region is shown, which does not affect the understanding of the manufacturing method).

Figure 5A:
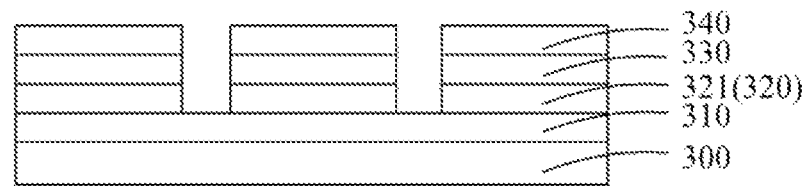
FIG. 5a-5h are structural flow schematic views of a manufacturing method of another stretchable display module provided by an embodiment of the present disclosure.
Figure 5B:
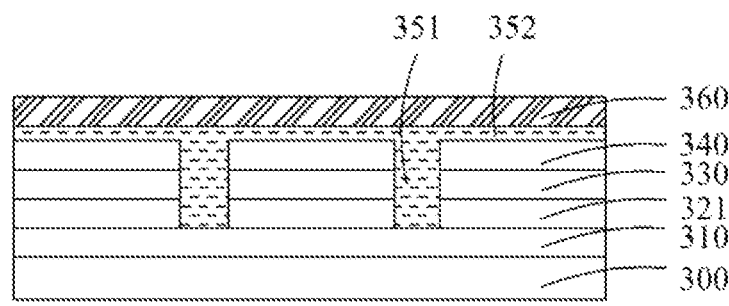
Figure 5C:
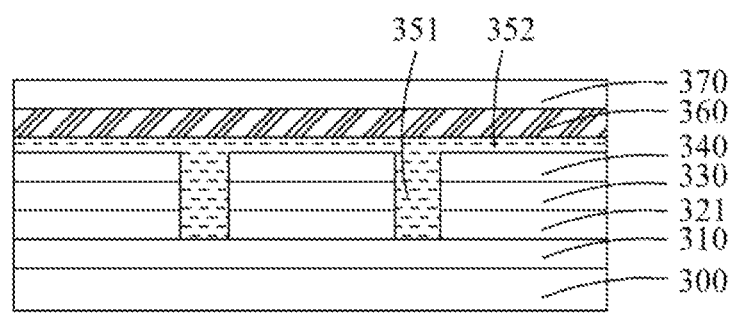
Figure 5D:
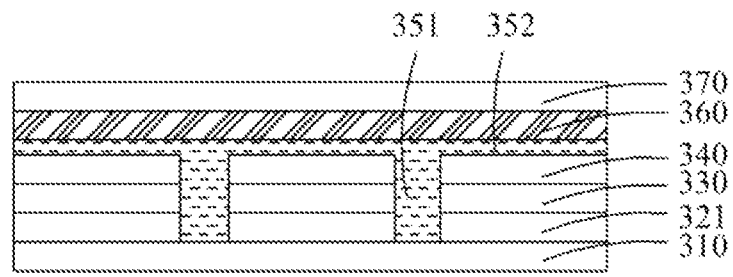
Figure 5E:
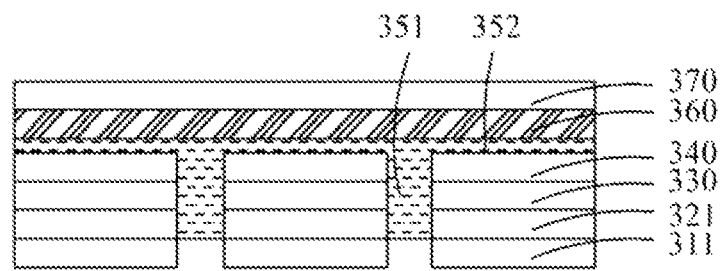
Figure 5F:
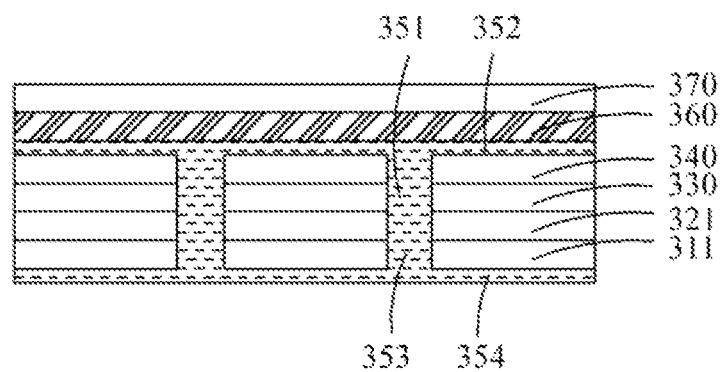
Figure 5G:
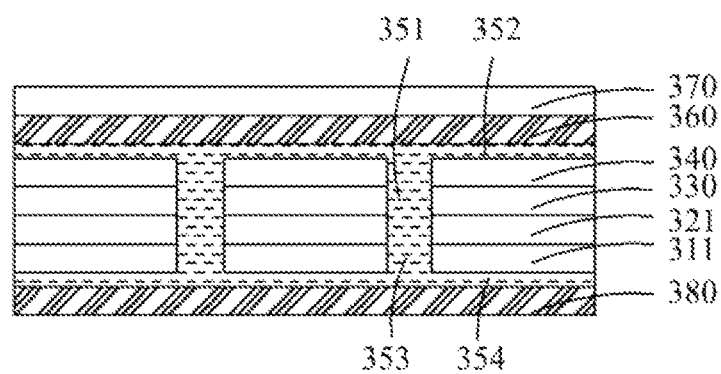
Figure 5H:
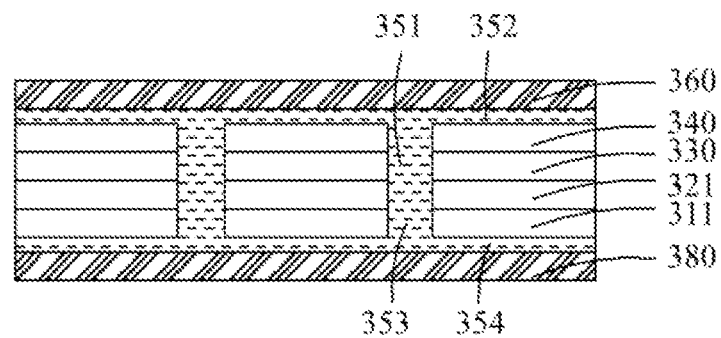
Figure 6:
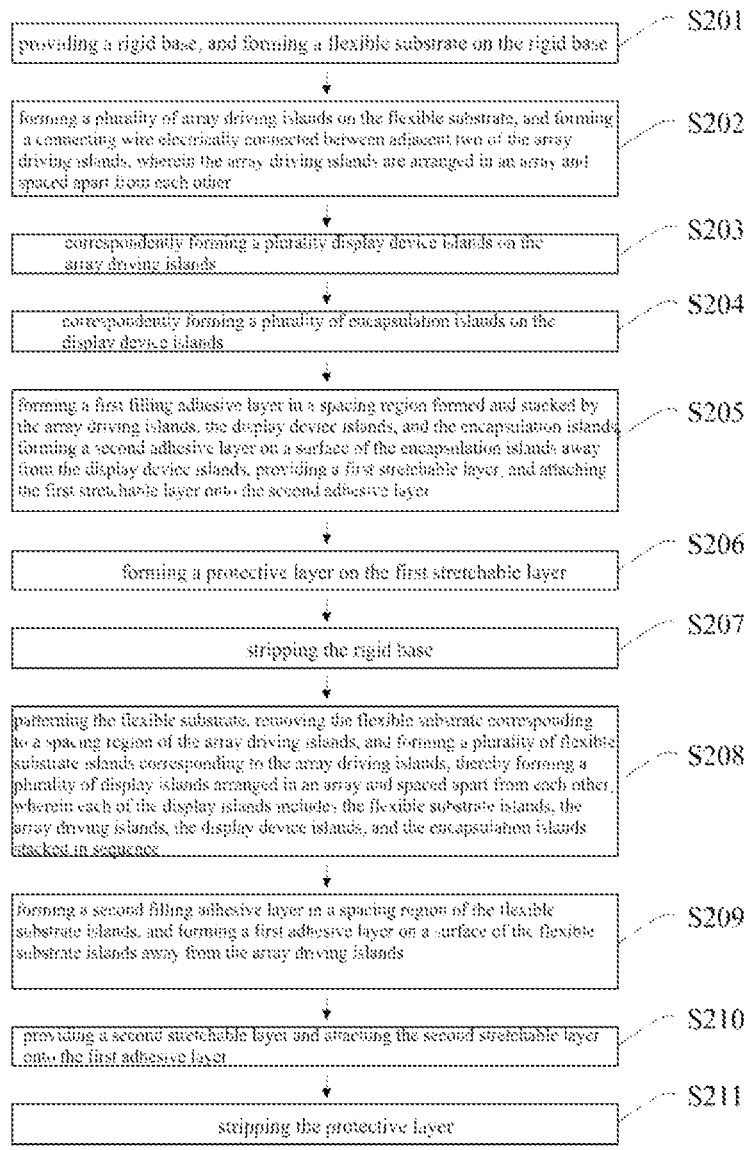
FIG. 6 is a schematic text flow chart of a manufacturing method of another stretchable display module provided by an embodiment of the present disclosure.

Specifically, the manufacturing method includes steps of:

S201, providing a rigid base 300, and forming a flexible substrate 310 on the rigid base 300;

S202, forming an array driving layer 320 on the flexible substrate 310, wherein the array driving layer 320 includes a plurality of array driving islands 321 and a connecting wire (not shown in the figures) electrically connected between adjacent ones of the array driving islands 321, the array driving islands 321 are arranged in an array and spaced apart from each other, and the array driving layer 320 certainly also includes a plurality of gate driving circuit islands, a bezel wire, a plurality of binding terminals, etc. in regions excluding the display region, which may be seen in the above embodiments for details;

S203, correspondently forming a plurality display device islands 330 on the array driving islands 321;

S204, correspondently forming a plurality of encapsulation islands 340 on the display device islands 330, which means that a structure shown in FIG. 5a is formed;

S205, forming a first filling adhesive layer 351 in a spacing region formed and stacked by the array driving islands 321, the display device islands 330, and the encapsulation islands 340, forming a second adhesive layer 352 on a surface of the encapsulation islands 340 away from the display device islands 330, providing a first stretchable layer 360, and attaching the first stretchable layer 360 onto the second adhesive layer 352, which means that a structure shown in FIG. 5b is formed;

S206, forming a protective layer 370 on the first stretchable layer 360, which means that a structure shown in FIG. 5c is formed;

S207, stripping the rigid base 300, which means that a structure shown in FIG. 5d is formed;

S208, patterning the flexible substrate 310, removing the flexible substrate corresponding to a spacing region of the array driving islands 321, and forming a plurality of flexible substrate islands 311 corresponding to the array driving islands 321, which means that a structure shown in FIG. 5e is formed, thereby forming a plurality of display islands formed by the flexible substrate islands 311, the array driving islands 321, the display device islands 330, and the encapsulation islands 340 stacked in sequence;

S209, forming a second filling adhesive layer 353 in a spacing region of the flexible substrate islands 311, and forming a first adhesive layer 354 on a surface of the flexible substrate islands 311 away from the array driving islands 321, which means that a structure shown in FIG. 5f is formed;

S210, providing a second stretchable layer 380 and attaching the second stretchable layer 380 onto the first adhesive layer 354, which means that a structure shown in FIG. 5g is formed; and S211, stripping the protective layer 370, which means that the manufacturing of the stretchable display module shown in FIG. 5h is completed.

It is noted that the embodiments of the stretchable display module above only describe the structures above. Understandably, in addition to the structures above, other necessary structures are included based on the need, which is not limited in the present disclosure.

In the embodiments above, the description of each embodiment has its own emphasis. For a part that is not specifically described in a certain embodiment, please refer to the relevant description of other embodiments, which are not redundantly described here.

A stretchable display module and a manufacturing method thereof provided by the embodiments of the present disclosure are described in detail as above. The principles and embodiments of the present disclosure are described in the specific examples. The description of the embodiments is only for helping understand the technical solutions and its core idea of the present disclosure. Furthermore, for those skilled in the art, the specific embodiments and scope of application may vary based on the idea of the present disclosure. In summary, the contents of the present specification should not be regarded as limitations to the present disclosure.

What is claimed is:

1. A stretchable display module, comprising:
a display layer comprising a plurality of display islands arranged in an array and spaced apart from each other, wherein adjacent two of the display islands are electrically connected by a connecting wire;
a transparent adhesive layer comprising a filling adhesive layer filled in a spacing region between the display islands, a first adhesive layer disposed on a surface of the display layer opposite an emitting direction of the display layer, and a second adhesive layer disposed on a surface of the display layer in the emitting direction, wherein the display islands are bonded as a whole by the transparent adhesive layer;
wherein the stretchable display module is partitioned into:
a stretchable region comprising a display region and a gate driving circuit region disposed outside the display region, wherein the display islands are disposed in the display region, the gate driving circuit region comprises a plurality of gate driving circuit islands spaced apart from each other, and adjacent two of the gate driving circuit islands are electrically connected by the connecting wire, and the adjacent gate driving circuit islands are electrically connected to the display islands by the connecting wire; and
a non-stretchable region connected to a side of the stretchable region, wherein the non-stretchable region comprises a bezel wire and a binding region.

2. The stretchable display module as claimed in claim 1, wherein the stretchable display module further comprises: a first stretchable layer attached on the first adhesive layer; and a second stretchable layer attached on the second adhesive layer.

3. The stretchable display module as claimed in claim 1, wherein each of the display islands individually and independently comprises a flexible substrate island, an array driving island disposed on the flexible substrate island, a display device island disposed on the array driving island, and an encapsulation island disposed on the display device island.

4. The stretchable display module as claimed in claim 1, wherein the connecting wire is a curve wire.

5. The stretchable display module as claimed in claim 1, wherein a material of the first stretchable layer and the second stretchable layer comprises polydimethylsiloxane.

6. The stretchable display module as claimed in claim 1, wherein a material of the transparent adhesive layer is an adhesive material comprising polydimethylsiloxane.

7. The stretchable display module as claimed in claim 1, wherein each of the display islands comprises a plurality of sub-pixels arranged in an array.

8. The stretchable display module as claimed in claim 2, wherein a Young's modulus of the first stretchable layer is greater than an 80% Young's modulus of the transparent adhesive layer and less than or equal to a 120% Young's modulus of the transparent adhesive layer, and a Young's modulus of the second stretchable layer is greater than the 80% Young's modulus of the transparent adhesive layer and less than or equal to the 120% Young's modulus of the transparent adhesive layer.

9. The stretchable display module as claimed in claim 3, wherein the connecting wire is disposed in the same layer as the array driving island.

10. The stretchable display module as claimed in claim 3, wherein the display device island comprises an organic light-emitting diode (OLED) display device or a micro light-emitting diode (Micro LED) display device.

11. The stretchable display module as claimed in claim 4, wherein the curve wire is formed by a wire portion bending and extending along at least two different directions.

12. The stretchable display module as claimed in claim 5, wherein each of the gate driving circuit islands comprises a second flexible substrate island and a gate driving circuit disposed on the second flexible substrate island.

13. The stretchable display module as claimed in claim 5, wherein a bezel wire is electrically connected to the adjacent display islands and the adjacent gate driving circuit islands by the connecting wire.

14. A manufacturing method for a stretchable display module, wherein the manufacturing method comprises steps of:
- S101, providing a rigid base and forming a flexible substrate on the rigid base;
- S102, forming a plurality of array driving islands on the flexible substrate, and forming a connecting wire electrically connected between adjacent ones of the array driving islands, wherein the array driving islands are arranged in an array and spaced apart from each other;
- S103, correspondently forming a plurality of display device islands on the array driving islands;
- S104, correspondently forming a plurality of encapsulation islands on the display device islands;
- S105, forming a protective layer on the encapsulation islands;
- S106, stripping the rigid base;
- S107, patterning the flexible substrate, removing the flexible substrate corresponding to a spacing region of the array driving islands, and forming a plurality of flexible substrate islands corresponding to the array driving islands, thereby forming a plurality of display islands arranged in an array and spaced apart from each other, wherein each of the display islands comprises the flexible substrate islands, the array driving islands, the display device islands, and the encapsulation islands stacked in sequence;
- S108, providing a first stretchable layer, forming a first adhesive layer on the first stretchable layer, and attaching the first adhesive layer onto a surface of the flexible substrate islands away from the array driving islands;
- S109, stripping the protective layer;
- S110, forming a filling adhesive layer in a spacing region of the display islands, and forming a second adhesive layer on a surface of the encapsulation islands away from the display device islands; and
- S111, providing a second stretchable layer and attaching the second stretchable layer onto the second adhesive layer;

wherein the stretchable display module is partitioned into:
- a stretchable region comprising a display region and a gate driving circuit region disposed outside the display region, wherein the display island are disposed in the display region, the gate driving circuit region comprises a plurality of gate driving circuit islands spaced apart from each other, and adjacent two of the gate driving circuit islands are electrically connected by the connecting wire, and the adjacent gate driving circuit islands are electrically connected to the display islands by the connecting wire; and
- a non-stretchable region connected to a side of the stretchable region, wherein the non-stretchable region comprises a bezel wire and a binding region.

15. The manufacturing method for the stretchable display module as claimed in claim 14, wherein in the step of S107, a patterning process is completed by an exposure and etching process or a laser cutting process.

16. The manufacturing method for the stretchable display module as claimed in claim 14, wherein in the step of S110, the filling adhesive layer and the second adhesive layer are simultaneously formed by one process.

17. A manufacturing method for a stretchable display module, wherein the manufacturing method comprises steps of:
- S201, providing a rigid base, and forming a flexible substrate on the rigid base;
- S202, forming a plurality of array driving islands on the flexible substrate, and forming a connecting wire electrically connected between adjacent two of the array driving islands, wherein the array driving islands are arranged in an array and spaced apart from each other;
- S203, correspondently forming a plurality display device islands on the array driving islands;
- S204, correspondently forming a plurality of encapsulation islands on the display device islands;
- S205, forming a first filling adhesive layer in a spacing region formed and stacked by the array driving islands, the display device islands, and the encapsulation islands, forming a second adhesive layer on a surface of the encapsulation islands away from the display device islands, providing a first stretchable layer, and attaching the first stretchable layer onto the second adhesive layer;
- S206, forming a protective layer on the first stretchable layer;
- S207, stripping the rigid base;
- S208, patterning the flexible substrate, removing the flexible substrate corresponding to a spacing region of the array driving islands, and forming a plurality of flexible substrate islands corresponding to the array driving islands, thereby forming a plurality of display islands arranged in an array and spaced apart from each other, wherein each of the display islands comprises the flexible substrate islands, the array driving islands, the display device islands, and the encapsulation islands stacked in sequence;
- S209, forming a second filling adhesive layer in a spacing region of the flexible substrate islands, and forming a first adhesive layer on a surface of the flexible substrate islands away from the array driving islands;
- S210, providing a second stretchable layer and attaching the second stretchable layer onto the first adhesive layer; and
- S211, stripping the protective layer;

wherein the stretchable display module is partitioned into:
- a stretchable region comprising a display region and a gate driving circuit region disposed outside the display region, wherein the display islands are disposed in the display region, the gate driving circuit region comprises a plurality of gate driving circuit islands spaced apart from each other, and adjacent two of the gate driving circuit islands are electrically connected by the connecting wire, and the adjacent gate driving circuit islands are electrically connected to the display islands by the connecting wire; and
- a non-stretchable region connected to a side of the stretchable region, wherein the non-stretchable region comprises a bezel wire and a binding region.

* * * * *